(12) United States Patent
Watanabe (10) Patent No.: US 12,512,817 B2
(45) Date of Patent: Dec. 30, 2025

(54) MULTI BAND FILTER PACKAGE WITH A COMMON GROUND CONNECTION

(71) Applicant: Skyworks Solutions, Inc., Irvine, CA (US)

(72) Inventor: Yasuhiro Watanabe, Yokohama (JP)

(73) Assignee: Skyworks Solutions, Inc., Irvine, CA (US)

( * ) Notice: Subject to any disclaimer, the term of this patent is extended or adjusted under 35 U.S.C. 154(b) by 429 days.

(21) Appl. No.: 17/936,324

(22) Filed: Sep. 28, 2022

(65) Prior Publication Data

US 2023/0105119 A1 Apr. 6, 2023

Related U.S. Application Data

(60) Provisional application No. 63/251,980, filed on Oct. 4, 2021.

(51) Int. Cl.
*H03H 9/64* (2006.01)
*H03H 9/25* (2006.01)
*H03H 9/72* (2006.01)
*H04B 1/40* (2015.01)

(52) U.S. Cl.
CPC ............ *H03H 9/6483* (2013.01); *H03H 9/25* (2013.01); *H03H 9/72* (2013.01); *H04B 1/40* (2013.01); *H03H 2250/00* (2013.01)

(58) Field of Classification Search
CPC ............... H03H 9/25; H03H 9/64; H03H 9/72
See application file for complete search history.

(56) References Cited

U.S. PATENT DOCUMENTS

| | | | |
|---|---|---|---|
| 7,446,629 B2 * | 11/2008 | Nakamura | H03H 9/14588 |
| | | | 333/133 |
| 7,609,129 B2 * | 10/2009 | Yokota | H03H 9/02952 |
| | | | 333/133 |
| 7,701,311 B2 | 4/2010 | Nakamura et al. | |
| 9,418,950 B2 | 8/2016 | Zhang et al. | |
| 10,050,522 B2 | 8/2018 | Scheel | |
| 10,050,653 B2 | 8/2018 | Pehlivanoglu | |
| 10,250,230 B2 * | 4/2019 | Ono | H03H 9/64 |
| 10,367,475 B2 | 7/2019 | Caron | |
| 10,469,056 B2 * | 11/2019 | Ruby | H03H 9/0576 |
| 10,541,673 B2 | 1/2020 | Caron | |
| 10,742,241 B2 | 8/2020 | Cook et al. | |
| 10,917,072 B2 * | 2/2021 | McHugh | H03H 9/174 |

(Continued)

*Primary Examiner* — Andrea Lindgren Baltzell
*Assistant Examiner* — Alan Wong
(74) *Attorney, Agent, or Firm* — Knobbe, Martens, Olson & Bear, LLP (57) ABSTRACT

A multi band filter package is disclosed. The multi band filter can include a first acoustic wave filter that is mounted on a carrier, a second acoustic wave filter mounted on the carrier, and a ground pad on the carrier. The first acoustic wave filter has a first filter component and a first shunt resonator. The second acoustic wave filter has a second filter component and a second shunt resonator. The first and second acoustic wave filters are arranged such that the first and second shunt resonators are positioned between the first and second filter component. The first and second shunt resonators are coupled to the ground pad by way of an electrically conductive path. A least a portion of the electrically conductive path is positioned between the first and second shunt resonators.

20 Claims, 8 Drawing Sheets

(56) References Cited

U.S. PATENT DOCUMENTS

| | | |
|---|---|---|
| 11,012,054 B2 | 5/2021 | Caron |
| 11,075,616 B2 | 7/2021 | Ando et al. |
| 11,101,787 B2 | 8/2021 | Ando et al. |
| 11,271,541 B2* | 3/2022 | Guyette ................ H03H 9/462 |
| 11,349,504 B2 | 5/2022 | Pehlke |
| 11,394,432 B2* | 7/2022 | Ruby ........................ H03F 3/19 |
| 11,411,552 B2 | 8/2022 | Komatsu |
| 11,437,976 B2 | 9/2022 | Kaneda et al. |
| 11,563,423 B2 | 1/2023 | Komatsu et al. |
| 11,700,039 B2 | 7/2023 | Ruby et al. |
| 11,742,829 B2 | 8/2023 | Komatsu et al. |
| 11,750,174 B2 | 9/2023 | Ando et al. |
| 11,799,447 B2 | 10/2023 | Kaneda et al. |
| 11,929,739 B2 | 3/2024 | Kankar et al. |
| 11,967,947 B2 | 4/2024 | Caron |
| 11,990,893 B2 | 5/2024 | Esquius Morote |
| 12,334,911 B2* | 6/2025 | Watanabe ............... H03H 9/568 |
| 2018/0138893 A1* | 5/2018 | Caron ..................... H04L 5/001 |
| 2019/0319772 A1 | 10/2019 | Ando et al. |
| 2020/0358424 A1 | 11/2020 | Kaneda et al. |
| 2021/0058069 A1 | 2/2021 | Komatsu |
| 2021/0067139 A1 | 3/2021 | Komatsu et al. |
| 2021/0119609 A1 | 4/2021 | Kaneda et al. |
| 2022/0294421 A1 | 9/2022 | Wang et al. |
| 2022/0294422 A1 | 9/2022 | Wang et al. |
| 2022/0294423 A1 | 9/2022 | Wang et al. |
| 2023/0107684 A1* | 4/2023 | Watanabe ............... H03H 9/605 455/73 |
| 2024/0223159 A1 | 7/2024 | Caron |

* cited by examiner

MULTI BAND FILTER PACKAGE WITH A COMMON GROUND CONNECTION

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/251,980, filed Oct. 4, 2021, titled "ACOUSTIC WAVE FILTER" are hereby incorporated by reference under 37 CFR 1.57 in their entirety.

BACKGROUND

Field

Embodiments of the invention relate to radio frequency (RF) modules and/or acoustic wave filters.

Description of the Related Technology

An acoustic wave filter can include a plurality of resonators arranged to filter a radio frequency signal. Example acoustic wave resonators include surface acoustic wave (SAW) resonators and bulk acoustic wave (BAW) resonators. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. A multi-mode SAW filter can include a plurality of longitudinally coupled interdigital transducer electrodes positioned between acoustic reflectors. In BAW resonators, acoustic waves propagate in a bulk of a piezoelectric layer. Example BAW resonators include film bulk acoustic wave resonators (FBARs) and solidly mounted resonators (SMRs).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer. As another example, four acoustic wave filters can be arranged as a quadplexer.

Acoustic wave filters with small package size are generally desirable. However, decreasing the size of an acoustic wave filter can be challenging.

SUMMARY

In certain embodiments, the present disclosure relates to an acoustic wave filter. The acoustic wave filter includes a first acoustic wave filter component configured to filter a first radio frequency signal, the first acoustic wave filter component having a first shunt resonator. The acoustic wave filter further includes a second acoustic wave filter component configured to filter a second radio frequency signal, the second acoustic wave filter component having a second shunt resonator. At a shared node the first and the second shunt resonator are electrically coupled to ground.

In a number of embodiments, one of the first and the second acoustic wave filter component is a surface acoustic wave (SAW) filter component.

In some embodiments, the filter architecture of the surface acoustic wave filter component is a Double Mode SAW (DMS) type. In several embodiments, the filter architecture of the surface acoustic wave filter component is a ladder type. In certain embodiments, the filter architecture of the surface acoustic wave filter component is a lattice type. In some embodiments, the filter architecture of the surface acoustic wave filter component is a hybrid ladder and lattice type.

In various embodiments, one of the first and the second acoustic wave filter component is a bulk acoustic wave (BAW) filter component.

In a number of embodiments, the bulk acoustic wave filter component comprises a bulk acoustic wave resonator. In a few embodiments, the bulk acoustic wave resonator is a film bulk acoustic wave resonator. In several embodiments, the bulk acoustic wave resonator is a Lamb wave resonator. In some embodiments, the bulk acoustic wave resonator is a surface mounted resonator. According to a number of embodiments, the filter architecture of the bulk acoustic wave filter component is of a ladder type, a lattice type or a hybrid ladder and lattice type.

In various embodiments, both the first and the second shunt resonator have an input connected to an input/output port of the respective acoustic wave filter component and an output connected to the shared node. In some embodiments, the output of the first shunt resonator has a distance to the output of the second shunt resonator in a range of about 0.01 μm to about 1 μm.

In certain embodiments, the first and the second acoustic wave filter component are connected in parallel.

In several embodiments, the first and the second acoustic wave filter component, the shared node and a ground pad are mounted on a substrate.

According to certain aspects, the disclosure relates to an acoustic wave filter. The acoustic wave filter includes a first acoustic wave filter component configured to filter a first radio frequency signal. The first acoustic wave filter component comprises a first shunt resonator. The acoustic wave filter further includes a second acoustic wave filter component configured to filter a second radio frequency signal. The second acoustic wave filter component comprises a second shunt resonator. An electrically conductive path between the first and the second shunt resonator has a common reference potential.

In a number of embodiments, the common reference potential is a ground potential.

In a number of embodiments, one of the first and the second acoustic wave filter component is a surface acoustic wave (SAW) filter component.

In some embodiments, the filter architecture of the surface acoustic wave filter component is a Double Mode SAW (DMS) type. In several embodiments, the filter architecture of the surface acoustic wave filter component is a ladder type. In certain embodiments, the filter architecture of the surface acoustic wave filter component is a lattice type. In some embodiments, the filter architecture of the surface acoustic wave filter component is a hybrid ladder and lattice type.

In various embodiments, one of the first and the second acoustic wave filter component is a bulk acoustic wave (BAW) filter component.

In a number of embodiments, the bulk acoustic wave filter component comprises a bulk acoustic wave resonator. In a few embodiments, the bulk acoustic wave resonator is a film bulk acoustic wave resonator. In several embodiments, the bulk acoustic wave resonator is a Lamb wave resonator. In some embodiments, the bulk acoustic wave resonator is a surface mounted resonator. According to a number of embodiments, the filter architecture of the bulk acoustic wave filter component is of a ladder type, a lattice type or a hybrid ladder and lattice type.

In various embodiments, both the first and the second shunt resonator have an input connected to an input/output port of the respective acoustic wave filter component and an output connected to the shared node. In some embodiments, the output of the first shunt resonator has a distance to the output of the second shunt resonator in a range of about 0.01 µm to about 1 µm.

According to certain aspects of the disclosure, a method of fabricating an acoustic wave filter is provided. In the method, a substrate having an oxide layer is provided. The oxide layer is coated with a photoresist to form a photoresist-coated substrate. A photomask with a predetermined pattern is placed on the photoresist-coated substrate, the pattern having light blocking areas for forming one ground pad, two acoustic wave filters and one electrically conductive path connecting the one ground pad to shunt resonators of the two acoustic wave filters. The photomask and the photoresist-coated substrate are exposed to light.

In a number of embodiments, the light blocking areas of the predetermined pattern form twice the number of acoustic wave filters compared to the number of ground pads.

Certain aspects of the disclosure relate to a radio frequency module. The radio frequency module includes a filter including an acoustic wave filter having a first acoustic wave filter with a first shunt resonator, a second acoustic wave filter with a second shunt resonator, and a shared node at which the first and the second shunt resonator are electrically coupled to ground. The radio frequency module further includes a radio frequency circuit element coupled to the filter, the filter and the radio frequency circuit element being enclosed within a common module package.

In a number of embodiments, the radio frequency module is configured as a front end module. In several embodiments, the radio frequency circuit element is a radio frequency amplifier arranged to amplify a radio frequency signal.

In a few embodiments, the radio frequency circuit element is a switch configured to selectively couple the filter to a port of the radio frequency module.

Certain aspects of the disclosure relate to a wireless communication device. The wireless communication device includes a filter including an acoustic wave filter having a first acoustic wave filter with a first shunt resonator, a second acoustic wave filter with a second shunt resonator, and a shared node at which the first and the second shunt resonator are electrically coupled to ground. The wireless communication device further includes an antenna operatively coupled to the filter. The wireless communication device further includes a radio frequency amplifier operatively coupled to the acoustic wave filter and configured to amplify a radio frequency signal. The wireless communication device comprises a transceiver in communication with the radio frequency amplifier.

In a number of embodiments, the wireless communication device further comprises a baseband processor in communication with the transceiver. In some embodiments, the filter is included in a radio frequency front end.

In one aspect, a multi band filter package is disclosed. The multi band filter package can include a first acoustic wave filter that is mounted on a carrier, a second acoustic wave filter mounted on the carrier, and a ground pad on the carrier. The first acoustic wave filter has a first filter component and a first shunt resonator. The second acoustic wave filter has a second filter component and a second shunt resonator. The first and second acoustic wave filters are arranged such that the first and second shunt resonators are positioned between the first and second filter component. The first and second shunt resonators are coupled to the ground pad by way of an electrically conductive path. A least a portion of the electrically conductive path is positioned between the first and second shunt resonators.

In one embodiment, the first and second shunt resonators are spaced by a distance in a range of 0.01 µm to 1 µm. The first and second shunt resonators can be spaced by a distance in a range of 0.01 µm to 0.5 µm. A width of the portion of the electrically conductive path between the first and second shunt resonators can define the distance between the first and second shunt resonators. A length of the portion of the electrically conductive path can extend with a length of the first shunt resonator. The length of the portion of the electrically conductive path can be at least 80% of the length of the first shunt resonator. The length of the portion of the electrically conductive path can extend along the length of the first shunt resonator completely.

In one embodiment, the first filter component includes a multimode surface acoustic wave resonator.

In one embodiment, the multi band filter package further includes a third filter mounted on the carrier. The third filter can have a third shunt resonator coupled to the ground pad. The multi band filter package can further include a fourth filter mounted on the carrier, and a second ground pad. A third shunt resonator of the third filter and a fourth shunt resonator of the fourth filter can be coupled to the second ground pad through a second electrically conductive path.

In one aspect, a multi band filter package is disclosed. The multiband filter package can include a first acoustic wave filter mounted on a carrier and a second acoustic wave filter mounted on the carrier. The first acoustic wave filter has a first filter component and a first shunt resonator. The second acoustic wave filter has a second filter component and a second shunt resonator. The first and second acoustic wave filters are arranged such that the first and second shunt resonators are positioned between the first and second filter component. The first and second shunt resonators are spaced by a distance in a range of 0.01 µm to 1 µm. The multiband filter package can include an electrically conductive path that has a portion positioned between the first and second shunt resonators. A width of the portion of the electrically conductive path between the first and second shunt resonators defines the distance between the first and second shunt resonators.

In one embodiment, the multi band filter package further includes a ground pad on the carrier. The first and second shunt resonators can be coupled to the ground pad by way of the electrically conductive path.

In one embodiment, a length of the portion of the electrically conductive path extends along a length of the first shunt resonator. The length of the portion of the electrically conductive path can be at least 80% of the length of the first shunt resonator. The length of the portion of the electrically conductive path can extend with the length of the first shunt resonator completely.

In one embodiment, the first filter component includes a multimode surface acoustic wave resonator.

In one embodiment, the first and second shunt resonators are spaced by a distance in a range of 0.01 µm to 0.5 µm.

In one embodiment, the multi band filter package further includes a third filter mounted on the carrier. The third filter can have a third shunt resonator coupled to the ground pad. The multi band filter package can further include a fourth filter mounted on the carrier, and a second ground pad. A third shunt resonator of the third filter and a fourth shunt resonator of the fourth filter can be coupled to the second ground pad through a second electrically conductive path.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/936,327, titled "ACOUSTIC WAVE FILTER WITH A COMMON GROUND NODE," filed on even date herewith.

BRIEF DESCRIPTION OF THE DRAWINGS

Embodiments of this disclosure will now be described, by way of non-limiting example, with reference to the accompanying drawings.

DETAILED DESCRIPTION OF EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. A SAW device can be, for example, a multimode longitudinally coupled SAW filter (e.g., a double mode SAW (DMS) filter) or a SAW resonator.

A packaged surface acoustic wave device can include one or more SAW filters. For example, a multi-band filter can include a plurality of filters. Providing separate filters as different dies can consume a relatively large area of a larger system. One solution to reduce the area needed for the filters is to package two or more filters in one die. However, when two or more filters are provided in a single die, the die size can be increased due to the additional wiring and connection pads to the package.

Aspects of this disclosure relate to SAW devices that include first and second acoustic wave filters which are electrically coupled to a shared node/electrically conductive path. Various embodiments disclosed herein relate to packaged multi-band filters that include a plurality of filters. At least two filters of the plurality of filters can be coupled to the same ground. The at least two filters can be coupled to the same ground by way of a shared electrically conductive path.

Certain embodiments disclosed herein relate to multimode longitudinally coupled surface acoustic wave filters. Such filters can be referred to as multimode surface acoustic wave (MMS) filters. MMS filters can include a plurality of IDT electrodes that are longitudinally coupled to each other and positioned between acoustic reflectors. Some MMS filters can be referred to as double mode surface acoustic wave (DMS) filters. There may be more than two modes of such DMS filters and/or for other MMS filters.

MMS filters can have a relatively wide passband due to a combination of various resonant modes. MMS filters can have a balanced (differential) input and/or a balanced output with proper arrangement of IDTs. MMS filters can achieve a relatively low loss and a relatively good out of band rejection.

MMS filters can be temperature compensated by including a temperature compensation layer, such as a silicon dioxide (SiO2) layer, over IDT electrodes. Such a temperature compensation layer can cause a temperature coefficient of frequency (TCF) of an MMS filter to be closer to zero. In some applications, an MMS filter can include a multi-layer piezoelectric substrate.

In certain applications, MMS filters can be receive filters arranged to filter radio frequency signals received by an antenna. MMS filters can be included in a receive filter that also includes a plurality of acoustic resonators arranged in a ladder topology.

Figure 1:
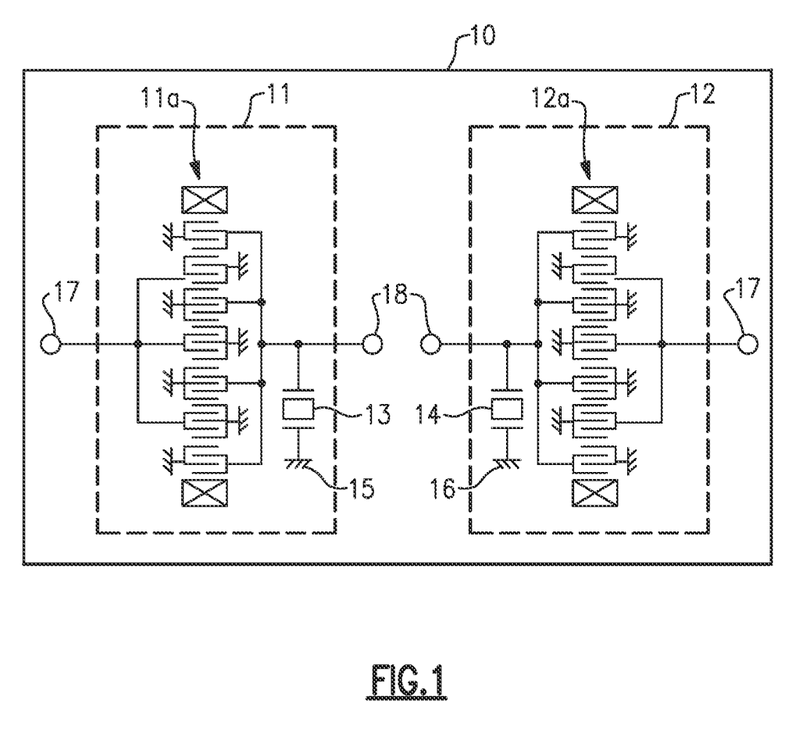
FIG. 1 is a schematic circuit topology of a conventional multi band filter.

FIG. 1 is a schematic diagram of a conventional multi band filter 10. The conventional multi band filter 10 includes a first SAW filter 11 with a first filter component 11, a second SAW filter 12 with a second filter component 12 and input/output ports 17, 18. The first SAW filter 11 and the second SAW filter 12 are packaged together.

The input/output ports 17, 18 connect the first SAW filter 11 and the second SAW filter 12, respectively, to a power supply. The first SAW filter 11 has a first shunt resonator 13 and a first ground pad 15 grounding the first shunt resonator 13. The second SAW filter 12 has a second shunt resonator 14 and a second ground pad 16 grounding the second shunt resonator 14. Each of the input/output ports 17, 18, first ground pad 15 and the second ground pad 16 are formed separately in the conventional multi band filter 10. Accordingly, areas needed for the input/output ports 17, 18, first ground pad 15 and the second ground pad 16 and respective wiring can be relatively large.

Figure 2:
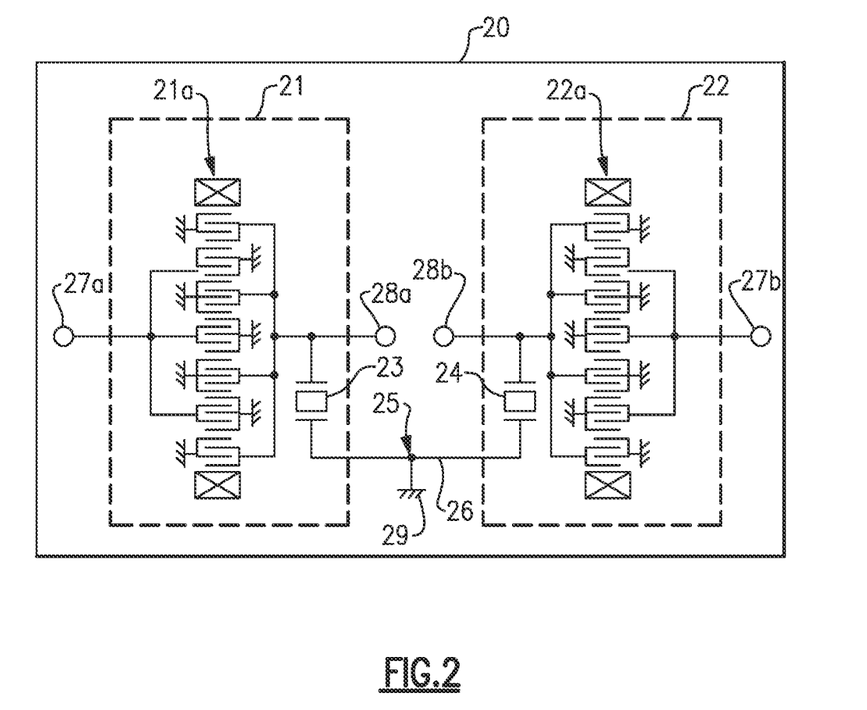
FIG. 2 is a schematic circuit topology of an acoustic wave filter according to an embodiment with double mode SAW (DMS) filter components.

FIG. 2 is a schematic circuit topology of an acoustic wave filter 20 according to an embodiment. The acoustic wave filter 20 can include a multi band filter. The acoustic wave filter 20 includes a double mode SAW (DMS) filters 21, 22. The first DMS filter 21 can include a first DMS filter component 21a and a first shunt resonator 23, and the second DMS filter 22 can include a second DMS filter component 22a and a second shunt resonator 24. The first and second shunt resonators 23, 24 can be coupled a shared node 25 and a ground pad 29 through an electrical routing 26 (e.g., a conductive trace). The acoustic wave filter 20 can be configured as a multi band filter.

The first DMS filter 21 is coupled to input/output ports 27a, 28b. The first DMS filter component 21a can include an IDT electrode that has IDT electrode fingers, and a pair of reflectors. Some of the IDT electrode fingers are electrically connected to the input port 27a, some of the IDT electrode fingers are electrically connected to the output port 28a and some of the IDT electrode fingers are electrically connected to the ground pad 29. Additionally, the first shunt resonator 23 can be electrically coupled to either the input port 27a or the output port 28a of the first DMS filter component 21. The first shunt resonator 23 can be coupled between the DMS filter component 21a and the ground pad 29.

The second DMS filter 22 is coupled to input/output ports 27b, 28b. The second DMS filter component 22a can include an IDT electrode that has IDT electrode fingers and reflectors. Some of the IDT electrode fingers are electrically connected to the input port 27b, some of the IDT electrode fingers are electrically connected to the output port 28b and some of the IDT electrode fingers are electrically connected to ground pad 29. Additionally, the second shunt resonator 24 can be electrically coupled to either the input port 27b or the output port 28b of the second DMS filter component 22. The second shunt resonator 24 can be coupled between the DMS filter component 22a and the ground pad 29.

For example, the first shunt resonator 23 and the second shunt resonator 24 can each have an input electrically connected to the input/output port 27a, 27b, 28a, 28b of the respective DMS filter components 21a, 22a and an output electrically coupled to the shared node 25. Further, the first and the second DMS filters 21, 22, the shared node 25, and the ground pad 29 can be mounted on a substrate. Additionally, the first and the second DMS filter components 21a, 22a are connected in parallel to a power supply.

Figure 4A:
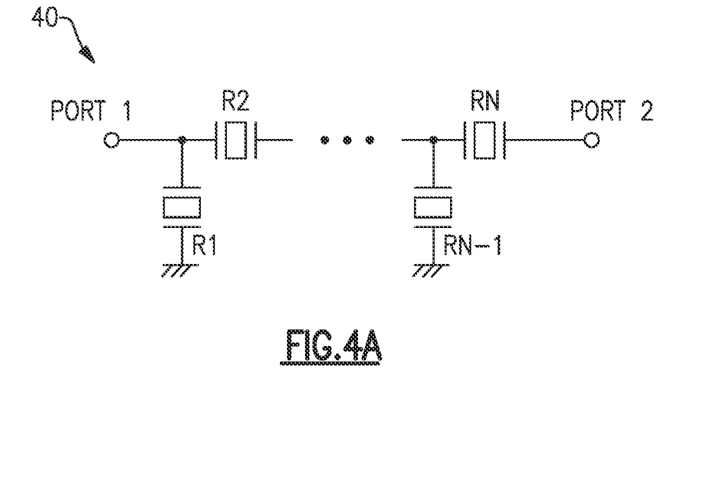
FIG. 4A is a schematic diagram of a ladder filter according to another embodiment.
Figure 5:
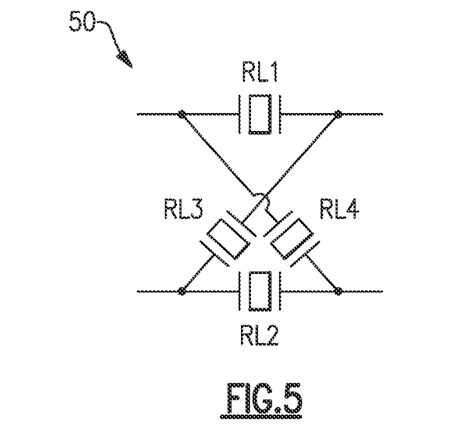
FIG. 5 is a schematic diagram of a lattice filter.
Figure 6:
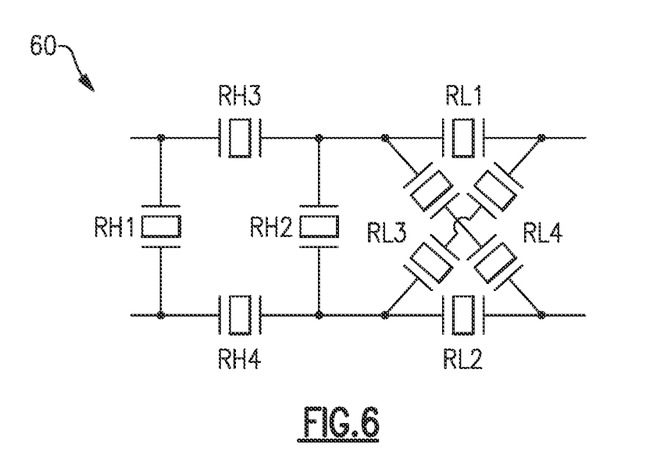
FIG. 6 is a schematic diagram of a hybrid ladder and lattice filter.

According to other embodiments, the acoustic wave filter 20 of FIG. 2 can include, but is not limited to, any of the acoustic wave filter components disclosed herein. For example, the filter architecture of the acoustic wave filter component can be of a ladder type as shown in FIG. 4A, of a lattice type as shown in FIG. 5, or of a hybrid ladder and lattice type as shown in FIG. 6. Additionally, the first shunt resonator 23 and/or the second shunt resonator 24 can include a plurality of shunt resonator members that are electrically coupled to the shared node 25. Alternatively or additionally, the first and/or the second acoustic wave filter component 21a, 22a can be configured as a bulk acoustic wave filter component including a bulk acoustic wave resonator being one of a film bulk acoustic wave resonator, a Lamb wave resonator (exemplarily shown in FIG. 4B), or a surface mounted resonator. Although FIG. 2 only shows two acoustic wave filter components 21a, 22a, the acoustic wave filter 20 can include any number and/or any type of filter components. Preferably, the acoustic wave filter 20 includes filter components twice the number of X, wherein X is the number of ground pads 29 (i.e., the number of filter components amounts to twice the number of ground pads). Thereby, each ground pad 29 can electrically ground two of the acoustic wave filter components 21a, 22a. In some embodiments, a number of the filter in the acoustic wave filter 20 can be greater than a number of the ground pad.

Figure 3A:
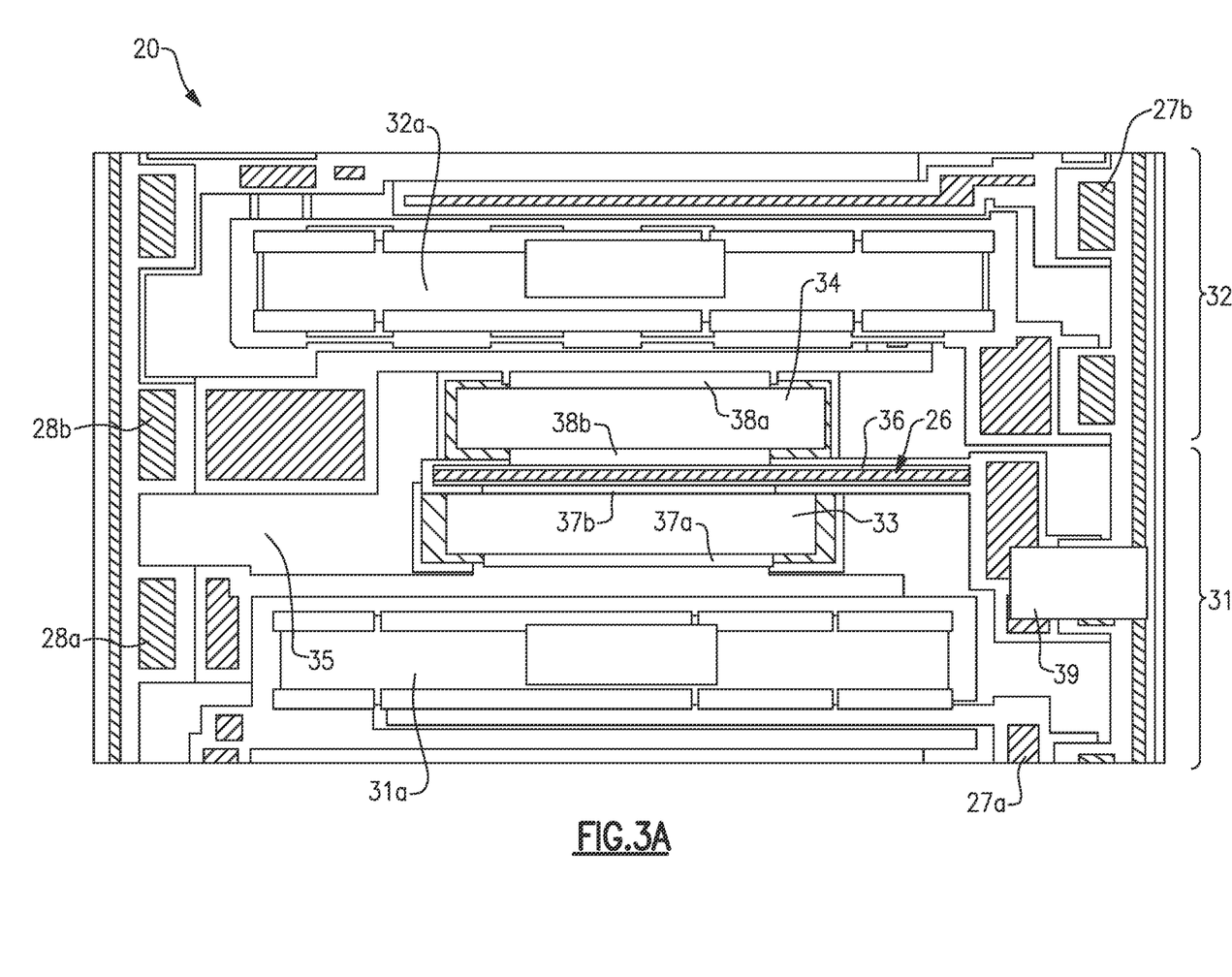
FIG. 3A is a schematic plan view of the acoustic wave filter of FIG. 2.

FIG. 3A is a schematic top plan view of the acoustic wave filter 20. Alternatively or additionally, the acoustic wave filter 20 can include, but is not limited to, any of the acoustic wave filter components disclosed herein. The acoustic wave filter 20 includes a first SAW filter 31, a second SAW filter 32, an electrically conductive path 36 that includes an electrical routing 26, input/output port 27a, 27b, 28a, 28b, and a ground pad 39 arranged and mounted on a carrier (e.g., a substrate 35). In some embodiments, the substrate can include a silicon package substrate.

The first SAW filter 31 has a first shunt resonator 33 with a first input 37a and a first output 37b. For example, the first input 37a can be electrically connected to the output port 28a as illustrated (or to the input port 27a in some other embodiments) of the first SAW filter 31, and the first output 37b can be electrically connected to the electrically conductive path 36 that includes the electrical routing 26. In some embodiments, the filter architecture of the first SAW filter component 31a can include a double mode SAW (DMS) type, a ladder type, a lattice type, or a hybrid ladder and lattice type.

The second SAW filter 32 has a second shunt resonator 34 with a second input 38a and a second output 38b. For example, the second input 38a can be electrically connected to the output port 28b (or to the input port 27b in some other embodiments) of the second SAW filter 32, and the second output 38b can be electrically connected to the electrically conductive path 36 that includes the electrical routing 26. In some embodiments, the filter architecture of the second SAW filter component 32a can include of a double mode SAW (DMS) type, a ladder type, a lattice type, or a hybrid ladder and lattice type.

The first and second shunt resonators 33, 34 can be spaced apart by a width of a portion the electrically conductive path 36. The output 37b and the output 38b can be sufficiently distanced to avoid or mitigate the portion the electrically conductive path 36 to have a significantly large resistance, as well as, to provide reliable ground connection. In some embodiments, the output 37b of the first shunt resonator 33 can have a distance to the output 38b of the second shunt resonator 34 in a range of about 10 µm to about 50 µm. For example, the distance between the output 37b and the output 38b can be in a range of 10 µm to 40 µm, 10 µm to 30 µm, 10 µm to 20 µm, 20 µm to 50 µm, 20 µm to 40 µm, or 20 µm to 30 µm. The width of the portion the electrically conductive path 36 between the first and second shunt resonators 33, 34 can be equal to or generally equal to the distance between the output 37b and the output 38b. As the distance between the output 37b and the output 38b increases, the portion the electrically conductive path 36 can take up more area or real estate on a surface of the acoustic wave filter 20. Accordingly, it may be undesirable to have a significantly large distance between output 37b and the output 38b for the portion the electrically conductive path 36.

As shown in FIG. 3A, the electrically conductive path 36 is located on the substrate 35 between the first and the second shunt resonators 33, 34. As illustrated, the first and the second shunt resonators 33, 34 can be arranged (e.g., oriented) such that the electrically the outputs 37b, 38b face each. The electrically conductive path 36 has a common reference potential. The common reference potential can be a ground potential. The electrically conductive path 36 can electrically couple the ground pad 39 and the first and the second shunt resonators 33, 34. The electrical routing 26 can at least partially define the electrically conductive path 36. Since the first and the second shunt resonators 33, 34 share the electrically conductive path 36, one point on the electrically conductive path corresponds to a shared node. In some embodiments, the electrically conductive path 36 can extend along a length of the first and/or the second shunt resonators 33, 34. For example, the electrically conductive path 36 can extend at least 70%, 80%, 90%, 100% of the length of the first or the second shunt resonator 33, 34. In some applications, it may be beneficial to minimizing the length of the electrically conductive path 36 to minimize resistance and inductance to thereby provide a reliable ground connection. By providing the electrically conductive path 36, an area for connecting the first and the second shunt resonators 33, 34 to the ground pad 39 can be smaller as compared to proving two separate paths for the first and the second shunt resonators 33, 34.

Although FIG. 3A only shows two SAW filters 31, 32, the acoustic wave filter 20 can include any number and/or any type of filters. In some embodiments, the acoustic wave filter 20 includes filter components twice the number of ground pad(s) (e.g., the number of filter components amounts to twice the number of ground pads). Thereby, each ground pad can electrically ground two of the SAW filter components 31, 32. For example, the number of filter components can be aligned next to each other on the substrate 35 such that the shunt resonators 33, 34 of two adjacent filters 31, 32 face each other thereby forming a block as it is illustrated in FIG. 3A. Such blocks including two filter components, one ground pad and one electrically conductive path connecting the ground pad to shunt resonators of the two filter components can be positioned in a space-saving manner on the substrate of a die. In some embodiments, three or more filters can share the same ground pad. In such embodiments, two or more electrically conductive paths may be provided to couple the filters to the same ground pad.

In some embodiments, the acoustic wave filter 20 shown in FIGS. 2 and 3 can be a portion of a filter package that includes a third filter and a fourth filter that have the same or generally similar arrangement as the first and second SAW filters 31, 32. In some other embodiments, the acoustic wave filter 20 shown in FIGS. 2 and 3 can be a portion of a filter package that includes a third filter that has a third shunt resonator coupled to the ground pad 39 or to a separate ground pad.

Providing a common ground pad (e.g., the ground pad 39) for two or more filters (e.g., the first and second 21, 22) packaged in a filter package may have an electrical characteristic mismatch between the electrical characteristics of the filters that share the same common ground pad. The electrical characteristic mismatch can degrade the performance of the filter(s). Accordingly, simply combining ground connections of two or more filters in a filter package may not provide a properly operable filter package. In some embodiments, pitches of filter components (e.g., the first and second DMS filter components 21a, 22a) and shunt resonators (e.g., the first and second shunt resonators 33, 34) mounted on a common carrier (e.g., the substrate 35) can be modulated or optimized to adjust for electrical characteristic mismatch.

Figure 3B:
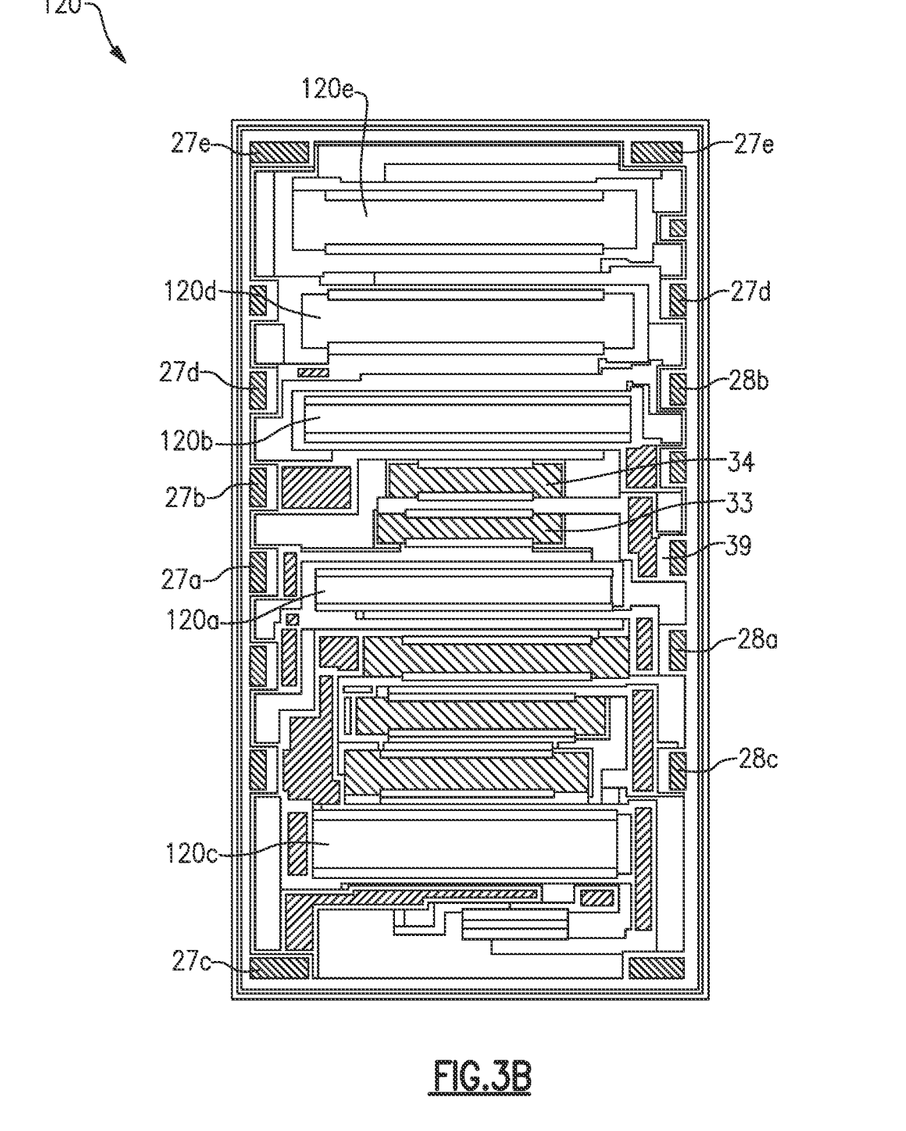
FIG. 3B is a schematic plan view of a packaged acoustic wave filter.

FIG. 3B is a schematic top plan view of an acoustic wave filter die 20'. In some embodiments, the filter die 20' can be a diversity module. The filter die 20' can include a first to fifth filters 120a-120e and first and second shunt resonators 33, 34. The first to fifth filters 120a-120e can have different frequency bands. The first to fifth filters 120a-120f can have corresponding first to fifth input/output connections 27a-27e, 28a-28e. The first shunt resonator 33 can be electrically connected between the first filter 120a and a ground pad 39. The second shunt resonator 34 can be electrically connected between the second filter 120b and the ground pad 39. As compared to having separate ground pads for the first and second shunt resonators 33, 34, by having the common ground pad 39 for the first and second shunt resonators 33, 34 the acoustic wave filter die 20' can be minimized.

FIG. 4A is a schematic diagram of a ladder filter 40 according to another embodiment. The ladder filter 40 includes a plurality of acoustic resonators R1, R2, . . . , RN-1, and RN arranged between a first input/output port PORT 1 and a second input/output port PORT 2. One of the input/output ports PORT 1 or PORT 2 can be an antenna port. In certain instances, the other of the input/output ports PORT 1 or PORT 2 can be a receive port. In some other instances, the other of the input/output ports PORT 1 or PORT 2 can be a transmit port.

The ladder filter 40 illustrates that any suitable number of ladder stages can be implemented in a ladder filter. Ladder stages can start with a series resonator or a shunt resonator from any input/output port of the ladder filter 40 as suitable. As illustrated, the first ladder stage from the input/output port PORT 1 can begin with a shunt resonator R1. As also illustrated, the first ladder stage from the input/output port PORT 2 can begin with a series resonator RN.

The ladder filter 40 includes shunt resonators R1 and RN-1 and series resonator R2 and RN. The series resonators of the ladder filter 40 including resonators R2 and RN can be acoustic resonators of a first type that have higher Q than series resonators of a second type in a frequency range below fs. The shunt resonators of the ladder filter 40 including resonators R1 and RN-1 can be acoustic resonators of the second type and have higher Q than shunt resonators of the first type in a frequency range between fs and fp. This can lead to a reduced insertion loss. The ladder filter 40 can be a band pass filter with series resonators of the first type and shunt resonators of the second type. In some other embodiments, the series resonators of the ladder filter 40 including resonators R2 and RN can be acoustic resonators of the second type and the shunt resonators of the ladder filter 40 including resonators R1 and RN-1 can be acoustic resonators of the first type. In such embodiments, the ladder filter 40 can be a band pass filter.

The resonators of the first type can be TCSAW resonators and the resonators of the second type can be BAW resonators. Accordingly, the ladder filter 40 can include series TCSAW resonators and shunt BAW resonators in certain embodiments. Such BAW resonators can include FBARs and/or solidly mounted resonators (SMRs).

The resonators of the first type can be multi-layer piezoelectric substrate (MPS) SAW resonators and the resonators of the second type can be BAW resonators. Accordingly, the ladder filter 40 can include series MPS SAW resonators and shunt BAW resonators. Such BAW resonators can include FBARs and/or SMRs in certain embodiments.

The resonators of the first type can be non-temperature compensated SAW resonators and the resonators of the second type can be BAW resonators. Accordingly, the ladder filter 40 can include series non-temperature compensated SAW resonators and shunt BAW resonators in certain embodiments. Such BAW resonators can include be FBARs and/or SMRs.

In a band pass filter with a ladder filter topology, such as the acoustic wave filter 40, the shunt resonators can have lower resonant frequencies than the series resonators. In certain embodiments, the shunt resonators of the acoustic wave filter 40 are BAW resonators and the series resonators of the acoustic wave filter 40 are TCSAW resonators. In such embodiments, the acoustic wave filter 40 can be a band pass filter. Such a band pass filter can achieve low insertion loss at both a lower band edge and an upper band edge of a passband.

In a band stop filter with a ladder filter topology, such as acoustic wave filter 40, the shunt resonators can have higher resonant frequencies than the series resonators. In certain embodiments, the acoustic wave filter 40 is a band stop filter, the shunt resonators of the acoustic wave filter 40 are TCSAW resonators and the series resonators of the acoustic wave filter 40 are BAW resonators. Such a band stop filter can achieve desirable characteristics in a stop band of the band stop filter.

In some applications of an acoustic wave filter that includes TC SAW series resonators and BAW shunt resonators, such as a transmit filter with a relatively high power handling specification, one or more series resonators close to a transmit port (or the lower frequency series resonators) can be BAW resonators to help with ruggedness.

In certain applications, the ladder filter 40 can be included in a multiplexer in which relatively high gamma for the ladder filter 40 in one or more higher frequency carrier aggregation bands is desired. In such applications, an acoustic filter can include shunt resonators of the shunt type and an acoustic resonator of the second type can be included as a series resonator by which other series resonators of the first type are coupled to a common port of the multiplexer. This can increase gamma of the ladder filter 40 in the one or more higher frequency carrier aggregation bands. For example, in applications where the second input/output port PORT 2 is a common port of a multiplexer, the series resonator RN can be a BAW resonator, other series resonators of the ladder filter 40 can be TCSAW resonators, and the shunt resonators R1 and RN-1 can be BAW resonators. By having the series resonator RN closest to the common node be a BAW resonator instead of a TCSAW resonator, gamma can be increased for the ladder filter 40 in one or more higher frequency carrier aggregation bands in such applications.

In some applications, the ladder filter 40 can be a transmit filter. In such applications, an acoustic resonator of the second type can be included as a series resonator by which other series resonators of the first type are coupled to a transmit port of the transmit filter. For example, in applications where the second input/output port PORT 2 is a transmit port of a transmit filter, the series resonator RN can be a BAW resonator, other series resonators of the ladder filter 40 can be TCSAW resonators, and the shunt resonators R1 and RN-1 can be BAW resonators.

In certain applications, the ladder filter 40 can include more than two types of acoustic resonators. In such applications, the majority of the series resonators can be acoustic resonators of the first type (e.g., TCSAW resonators) and the majority of shunt resonators can be resonators of the second type (e.g., BAW resonators). The ladder filter 40 can include a third type of resonator as a shunt resonator and/or as a series resonator in such applications. The third type of resonator can be a Lamb wave resonator, for example. One such example Lamb wave resonator will be discussed with reference to FIG. 4B. The acoustic wave filter 40 can include a plurality series resonators including temperature compensated surface acoustic wave resonators and a plurality shunt resonators including a Lamb wave resonator arranged as shunt resonator. The acoustic wave filter 40 can include a plurality series resonators including a Lamb wave resonator and a plurality shunt resonators including bulk acoustic wave resonators arranged as shunt resonators.

Figure 4B:
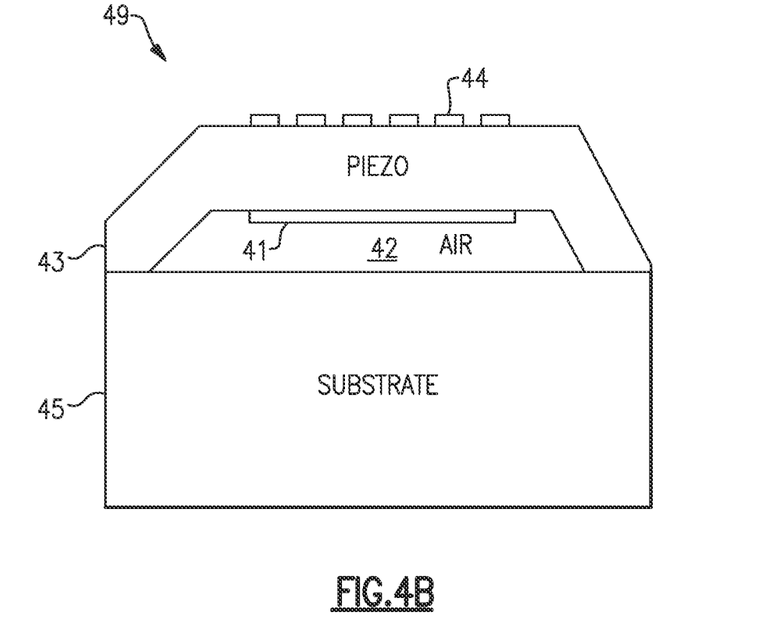
FIG. 4B is a cross sectional diagram of a Lamb wave resonator.

FIG. 4B is a cross sectional diagram of a Lamb wave resonator 49. A Lamb wave resonator can implement one or more series resonators and/or one or more shunt resonators in the ladder filter 40 (see FIG. 4A). The Lamb wave resonator 49 includes feature of a SAW resonator and an FBAR. As illustrated, the Lamb wave resonator 49 includes a piezoelectric layer 43, an IDT electrode 44 on the piezoelectric layer 43, and an electrode 41. The resonant frequency of the Lamb wave resonator 49 can be based on the thickness of the piezoelectric layer 43 and/or the geometry of the IDT electrode 44. An air cavity 42 is disposed between the electrode 41 and a substrate 45. Although the Lamb wave resonator 49 of FIG. 4A is a free standing Lamb wave resonator, a solidly mounted resonator (SMR) Lamb wave resonator with a solid acoustic mirror (e.g., acoustic Bragg reflectors) can alternatively or additionally be implemented.

An acoustic wave filter including more than one type of acoustic resonator in accordance with any suitable principles and advantages disclosed herein can be implemented in a variety of different filter topologies. Example filter topologies include without limitation ladder filters, lattice filters, hybrid ladder and lattice filters, filters that include ladder stages and a multi-mode SAW filter, and the like. Some example filter topologies will now be discussed.

FIG. 5 is a schematic diagram of a lattice filter 50. The lattice filter 50 is an example topology of a band pass filter formed from acoustic wave resonators. The lattice filter 50 can be arranged to filter an RF signal. As illustrated, the lattice filter 50 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 50 has a balanced input and a balanced output. The lattice filter 50 can be implemented with different type of acoustic resonators in accordance with any suitable principles and advantages disclosed herein. For example, the series resonators RL1 and RL2 can be TCSAW resonators and the shunt resonators RL3 and RL4 can be BAW resonators for a band pass filter.

FIG. 6 is a schematic diagram of a hybrid ladder and lattice filter 60. The illustrated hybrid ladder and lattice filter includes series acoustic resonators RL1, RL2, RH3, and RH4 and shunt acoustic resonators RL3, RL4, RH1, and RH2. The hybrid ladder and lattice filter 60 can be implemented with different type of acoustic resonators in accordance with any suitable principles and advantages disclosed herein. For example, the series resonators RL1, RL2, RH3, and RH4 can be TCSAW resonators and the shunt resonators RL3, RL4, RH1, and RH2 can be BAW resonators for a band pass filter.

Figure 7:
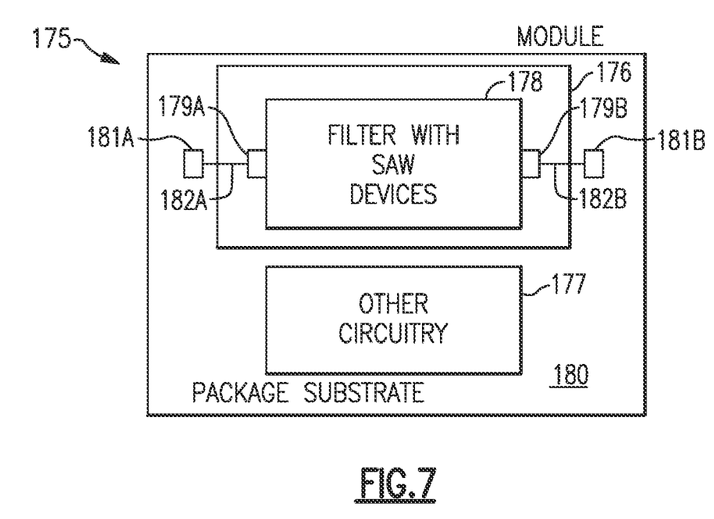
FIG. 7 is a schematic diagram of a radio frequency module that includes a surface acoustic wave resonator according to an embodiment.

FIG. 7 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW devices with any suitable combination of features of the SAW devices disclosed herein. The SAW component 176 can include a SAW die that includes one or more MMS filters and/or one or more SAW resonators.

The SAW component 176 shown in FIG. 7 includes a filter 178 and terminals 179A and 179B. The filter 178 includes SAW devices. One or more of the SAW devices can be implemented in accordance with any suitable principles and advantages of any MNMS filter disclosed herein. The terminals 179A and 179B can serve, for example, as an input contact and an output contact. The SAW component 176 and the other circuitry 177 are on a common packaging substrate 180 in FIG. 7. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 8:
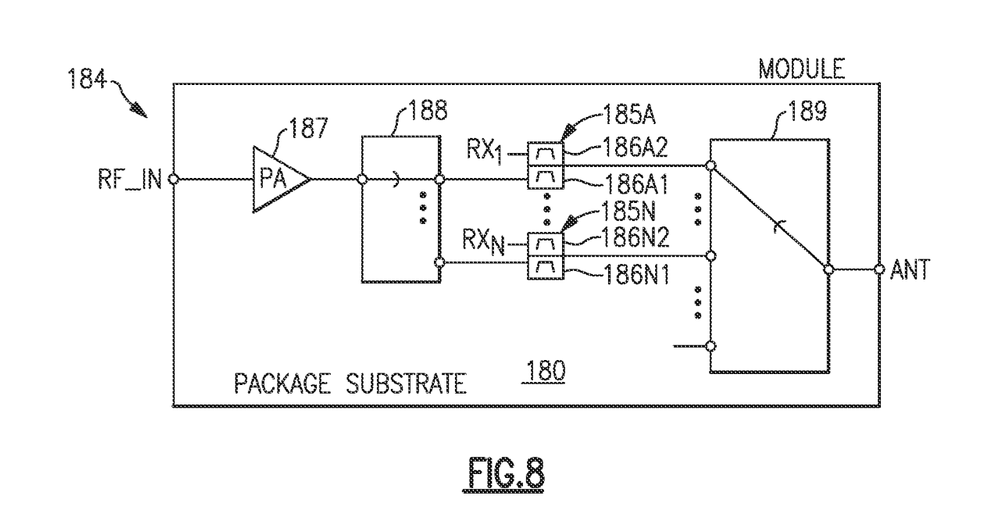
FIG. 8 is a schematic diagram of a radio frequency module that includes filters with surface acoustic wave resonators according to an embodiment.

FIG. 8 is a schematic diagram of a radio frequency module 184 that includes a surface acoustic wave device according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW devices in accordance with any suitable principles and advantages disclosed herein. Similarly, one or more of the receive filters 186A2 to 186N2 can include one or more SAW devices in accordance with any suitable principles and advantages disclosed herein. Although FIG. 8 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 9:
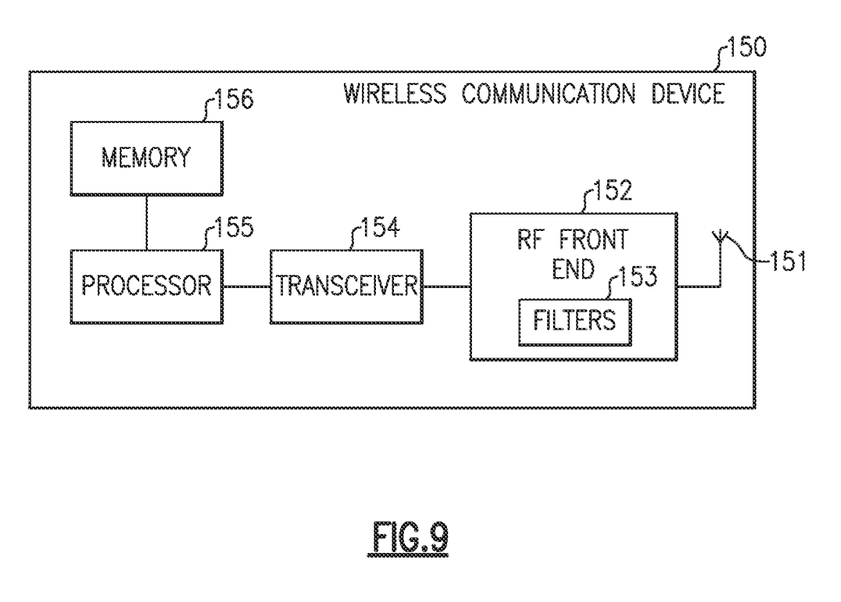
FIG. 9 is a schematic block diagram of a wireless communication device that includes filters in accordance with one or more embodiments.

FIG. 9 is a schematic block diagram of a wireless communication device 150 that includes filters 153 in accordance with one or more embodiments. The wireless communication device 150 can be any suitable wireless communication device. For instance, a wireless communication device 150 can be a mobile phone, such as a smart phone. As illustrated, the wireless communication device 150 includes an antenna 151, an RF front end 152, an RF transceiver 154, a processor 155, and a memory 156. The antenna 151 can transmit RF signals provided by the RF front end 152. The antenna 151 can provide received RF signals to the RF front end 152 for processing.

RF front end 152 can include one or more power amplifiers, one or more low noise amplifiers, RF switches, receive filters, transmit filters, duplexer or other multiplexers, or any combination thereof. The RF front end 152 can transmit and receive RF signals associated with any suitable communication standards. Any of the acoustic wave filters, duplexers, and/or multiplexers discussed herein can be implemented by the filters 153 of the RF front end 152.

The RF transceiver 154 can provide RF signals to the RF front end 152 for amplification and/or other processing. The RF transceiver 154 can also process an RF signal provided by a low noise amplifier of the RF front end 152. The RF transceiver 154 is in communication with the processor 155. The processor 155 can be a baseband processor. The processor 155 can provide any suitable base band processing functions for the wireless communication device 150. The memory 156 can be accessed by the processor 155. The memory 156 can store any suitable data for the wireless communication device 150.

Some of the embodiments described above have provided examples in connection with wireless devices or mobile phones. However, the principles and advantages of the embodiments can be used for any other systems or apparatus that have needs for acoustic wave filters.

Such acoustic wave filters can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A multi band filter package comprising:
a first acoustic wave filter mounted on a carrier, the first acoustic wave filter having a first filter component and a first shunt resonator;
a second acoustic wave filter mounted on the carrier, the second acoustic wave filter having a second filter component and a second shunt resonator, the first and second acoustic wave filters arranged such that the first and second shunt resonators are positioned between the first and second filter component, the first and second shunt resonators spaced by a distance in a range of 0.01 µm to 1 µm; and
a ground pad on the carrier, the first and second shunt resonators coupled to the ground pad by way of an electrically conductive path, at least a portion of the electrically conductive path being positioned between the first and second shunt resonators.

2. The multi band filter package of claim 1 wherein at least one of the first and second acoustic wave filters include a bulk acoustic wave filter component.

3. The multi band filter package of claim 2 wherein the first and second shunt resonators are spaced by a distance in a range of 0.01 µm to 0.5 µm.

4. The multi band filter package of claim 2 wherein a width of the portion of the electrically conductive path between the first and second shunt resonators defines the distance between the first and second shunt resonators.

5. The multi band filter package of claim 4 wherein a length of the portion of the electrically conductive path extends with a length of the first shunt resonator, the length of the portion of the electrically conductive path is at least 80% of the length of the first shunt resonator.

6. The multi band filter package of claim 5 wherein the length of the portion of the electrically conductive path extends along the length of the first shunt resonator completely.

7. The multi band filter package of claim 1 wherein the first filter component includes a multimode surface acoustic wave resonator.

8. The multi band filter package of claim 1 further comprising a third filter mounted on the carrier.

9. The multi band filter package of claim 8 wherein the third filter has a third shunt resonator coupled to the ground pad.

10. The multi band filter package of claim 8 further comprising a fourth filter mounted on the carrier, and a second ground pad, a third shunt resonator of the third filter and a fourth shunt resonator of the fourth filter are coupled to the second ground pad through a second electrically conductive path.

11. A multi band filter package comprising:
a first acoustic wave filter mounted on a carrier, the first acoustic wave filter having a first filter component and a first shunt resonator;
a second acoustic wave filter mounted on the carrier, the second acoustic wave filter having a second filter component and a second shunt resonator, the first and second acoustic wave filters arranged such that the first and second shunt resonators are positioned between the first and second filter component, the first and second shunt resonators being spaced by a distance in a range of 0.01 µm to 1 µm; and
an electrically conductive path having a portion positioned between the first and second shunt resonators, a width of the portion of the electrically conductive path between the first and second shunt resonators defines the distance between the first and second shunt resonators.

12. The multi band filter package of claim 11 further comprising a ground pad on the carrier, the first and second shunt resonators coupled to the ground pad by way of the electrically conductive path.

13. The multi band filter package of claim 11 wherein a length of the portion of the electrically conductive path extends along a length of the first shunt resonator, the length of the portion of the electrically conductive path is at least 80% of the length of the first shunt resonator.

14. The multi band filter package of claim 11 wherein a length of the portion of the electrically conductive path extends with a length of the first shunt resonator completely.

15. The multi band filter package of claim 11 wherein the first filter component includes a multimode surface acoustic wave resonator.

16. The multi band filter package of claim 11 wherein the first and second shunt resonators are spaced by a distance in a range of 0.01 μm to 0.5 μm.

17. The multi band filter package of claim 11 further comprising a third filter mounted on the carrier.

18. The multi band filter package of claim 17 wherein the third filter has a third shunt resonator coupled to a ground pad.

19. The multi band filter package of claim 17 further comprising a fourth filter mounted on the carrier, and a second ground pad, a third shunt resonator of the third filter and a fourth shunt resonator of the fourth filter are coupled to the second ground pad through a second electrically conductive path.

20. The multi band filter package of claim 11 wherein at least one of the first and second acoustic wave filters include a bulk acoustic wave filter component.

* * * * *